United States Patent
Voisine

(10) Patent No.: US 9,470,727 B2
(45) Date of Patent: Oct. 18, 2016

(54) DETECTION OF MAGNETIC FIELDS USING LEADING POWER FACTOR

(75) Inventor: John T. Voisine, Lafayette, IN (US)

(73) Assignee: Landis+Gyr Inc., Lafayette, IN (US)

( * ) Notice: Subject to any disclaimer, the term of this patent is extended or adjusted under 35 U.S.C. 154(b) by 1053 days.

(21) Appl. No.: 13/315,272

(22) Filed: Dec. 8, 2011

(65) Prior Publication Data

US 2012/0150462 A1    Jun. 14, 2012

Related U.S. Application Data

(60) Provisional application No. 61/421,205, filed on Dec. 8, 2010.

(51) Int. Cl.
| | |
|---|---|
| G06F 19/00 | (2011.01) |
| G01R 25/00 | (2006.01) |
| G01R 22/06 | (2006.01) |
| G01R 11/17 | (2006.01) |
| G01R 33/02 | (2006.01) |
| G01R 11/24 | (2006.01) |

(52) U.S. Cl.
CPC ............ G01R 22/068 (2013.01); G01R 11/17 (2013.01); G01R 11/24 (2013.01); G01R 22/066 (2013.01); G01R 33/02 (2013.01)

(58) Field of Classification Search
CPC .... G01R 33/02; G01R 11/17; G01R 22/066; G01R 11/24
USPC ........... 702/62, 183; 323/211; 318/729, 809, 318/798; 324/207.18, 164, 207.12
See application file for complete search history.

(56) References Cited

U.S. PATENT DOCUMENTS

| | | | | |
|---|---|---|---|---|
| 3,419,792 A * | 12/1968 | Kasper | .................. | H02J 3/1828 219/664 |
| 4,387,329 A * | 6/1983 | Harlow | .................... | H02P 23/26 318/729 |
| 4,459,528 A * | 7/1984 | Nola | ........................ | H02P 23/26 318/729 |
| 5,469,045 A * | 11/1995 | Dove | ..................... | H02J 3/1892 323/210 |
| 5,736,838 A * | 4/1998 | Dove | ..................... | H02J 3/1892 323/210 |
| 5,942,893 A * | 8/1999 | Terpay | ............... | G01N 27/9033 324/164 |
| 8,134,346 B1 * | 3/2012 | Huta et al. | ..................... | 323/211 |
| 8,305,737 B2 * | 11/2012 | Ewing | ..................... | G06F 1/266 174/59 |
| 8,373,394 B1 * | 2/2013 | Huta et al. | ..................... | 323/211 |
| 2010/0187914 A1 * | 7/2010 | Rada et al. | ................... | 307/105 |
| 2011/0202293 A1 * | 8/2011 | Kobraei | ................. | G06Q 50/06 702/62 |

* cited by examiner

*Primary Examiner* — Carol S Tsai

(74) *Attorney, Agent, or Firm* — Maginot, Moore & Beck LLP

(57) ABSTRACT

An electricity meter includes a sensor circuit, a measurement circuit, a leading PF detection circuit and a control circuit. The sensor circuit is operably connected to detect voltage and current provided to a load, and generates corresponding voltage and current measurement signals. The measurement circuit is configured to generate energy consumption information based on the voltage and current measurement signals. The leading PF detection circuit is configured to generate a first value representative of a phase difference of the current measurement signal with respect to the voltage measurement signal, and to generate a leading PF detection signal responsive to determining that the first value corresponds to a leading power factor that leads unity power factor by more than a predetermined threshold. The control circuit stores an indication in memory responsive at least in part to the leading PF detection signal.

20 Claims, 4 Drawing Sheets

DETECTION OF MAGNETIC FIELDS USING LEADING POWER FACTOR

This application claims the benefit of U.S. Provisional Patent Application No. 61/421,205, filed Dec. 8, 2010, and which is incorporated herein by reference.

FIELD OF THE INVENTION

The present invention relates to electricity meters, and more specifically, to arrangements and methods that detect excessive magnetic fields within electricity meters.

BACKGROUND

Electrical service providers such as electrical utilities employ electricity meters to monitor energy consumption by customers (or other entities). Electricity meters track the amount of energy consumed by a load (e.g. the customer), typically measured in kilowatt-hours ("kwh") at each customer's facility. The service provider uses the consumption information primarily for billing, but also for resource allocation forecasting and other purposes.

One problem with many electricity meters is that external forces can sometimes alter the accuracy of the metering operation. While meters are typically housed in a manner that reduces the impact of external elements, there are some circumstances in which external forces become an issue. For example, it is known that current sensors currently used in many electricity meters have sensitivity to strong magnetic fields. Strong magnetic fields can affect the ability of certain current sensors to measure the current provided to the load. Without accurate current measurements, the energy consumption measurement will exhibit errors.

The problems arising from the exposure of an electricity meter to strong externally generated magnetic fields is discussed, by way of example, in U.S. Pat. No. 7,495,555, which is incorporated herein by reference.

To combat potential magnetic field issues, it has been known to place a ferromagnetic shielding structure around the CT or the entire interior of the meter to reduce the impact of the magnetic field on interior components. However, magnetic shielding requires additional material and labor cost, and undesirably increases the weight of the meter.

It is also known to employ a sensor to detect and flag excess magnetic fields within the meter. See U.S. Patent Publication No. 2010/0072990 and U.S. Pat. No. 7,495,555 for examples of this method. A drawback to the sensor method is the requirement for additional equipment in the meter (in the form of the magnetic sensors). In addition, retrofitting existing meters in the field with such capabilities is not plausible because it requires installation of new circuitry within the meter.

There is a need, therefore, for a more cost-effective approach to combating the potential for inaccurate metering due to excess magnetic fields that has reduced equipment cost. There is also a need for an approach to combating issues relating to excessive magnetic fields that can be more readily retrofitted into existing meters.

SUMMARY

The proposed invention includes methods and apparatus for detecting a leading power factor load as a possible indicator of the presence of a magnetic field, and/or errors cause by the presence of a magnetic field, in the vicinity of an electricity meter. If a load having a leading power factor above a certain threshold is detected, then a flag indicating a possible excessive magnetic field can be set. This "possible magnetic field" flag can be displayed locally and/or communicated over a wide area network when the meter is part of the network.

A first embodiment is an electricity meter that includes a sensor circuit, a measurement circuit, a leading PF detection circuit and a control circuit. The sensor circuit is operably connected to detect voltage and current representative of, respectively, voltage and current provided to a load. The sensor circuit generates a voltage measurement signal based on the detected voltage and a current measurement signal based on the detected current. The measurement circuit is configured to generate energy consumption information based on the voltage measurement signal and the current measurement signal. The leading PF detection circuit is configured to generate a first value representative of a phase difference of the current measurement signal with respect to the voltage measurement signal, and to generate a leading PF detection signal responsive to determining that the first value corresponds to a leading power factor that leads unity power factor by more than a predetermined threshold. The control circuit stores an indication in memory responsive at least in part to the leading PF detection signal.

Accordingly, the arrangement generates an indication of possible extraneous magnetic fields (and possibly other conditions that also affect meter accuracy) by detecting leading phase angle in the measurements generated by a utility meter. Thus, the need for separate magnetic sensors and shields is obviated.

The above-described features and advantages, as well as others, will become more readily apparent to those of ordinary skill in the art by reference to the following detailed description and accompanying drawings.

DETAILED DESCRIPTION

Figure 1:
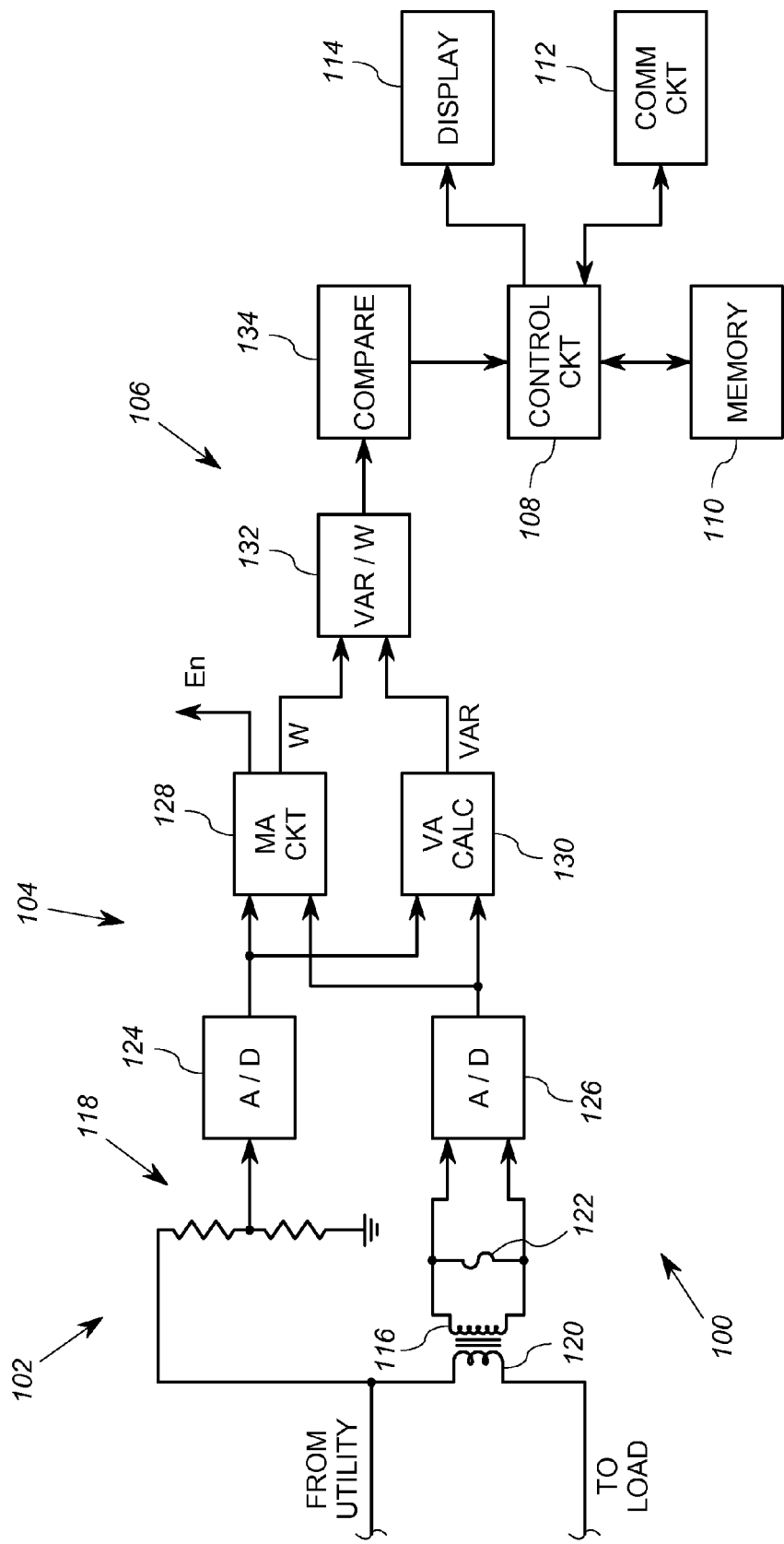
FIG. 1 shows a functional block diagram of an exemplary arrangement for detecting possible magnetic fields that can be employed within an electricity meter.

FIG. 1 shows a functional block diagram of an exemplary arrangement 100 for detecting a condition, such as the presence of a magnetic field, that can cause inaccurate metering calculations within an electricity meter. The arrangement 100 is employed within the meter housing, not shown. The arrangement 100 includes a sensor circuit 102, a measurement circuit 104, a leading PF detection circuit 106, and a control circuit 108. The arrangement also includes a memory 110, a communication circuit 112, and a display 114.

The sensor circuit 102 is operably connected to detect voltage and current representative of, respectively, voltage and current provided to a load. The sensor circuit 102 is configured to generate a voltage measurement signal based on the detected voltage and a current measurement signal based on the detected current. To this end, the sensor circuit 102 may be any conventional circuit used in an electricity meter to generate voltage and current waveforms that represent reduced magnitude versions of the actual voltage and current signals delivered to the load by a utility service provider. The load, not shown, may comprise the electrical system of a residential, commercial, industrial, or agricultural facility, by way of example.

In this embodiment, the sensor circuit 102 includes a current transformer 116 and a voltage sensor 118. The current transformer 116 is inductively coupled to a current coil 120 that carries the current provided to the load. A burden resistor 122 is coupled across the secondary leads of the current transformer 116. The voltage sensor 118 in this embodiment is a voltage divider operably coupled to the current coil 120.

The measurement circuit 104 is a circuit configured to generate energy consumption information based on the voltage measurement signal and the current measurement signal received from the sensor circuit 102. In this embodiment, the measurement circuit 104 includes A/D converters 124, 126, and a multiply and accumulate ("MA") circuit 128. The A/D converters 124, 126 are coupled, respectively, to the voltage sensor 118 and the current transformer 116. The A/D converter 124 generates a digital voltage measurement signal in the form of a sampled waveform of the voltage measurement signal. Similarly, and the A/D converter 126 generates a digital current measurement signal in the form of a sampled waveform of the current measurement signal.

The MA circuit 128 is operably coupled to receive the voltage and current measurement signals and generate energy consumption information therefrom. For example, the MA circuit 128 is a circuit configured to multiply contemporaneous voltage and current samples from the digital voltage and current measurement signals in an ongoing manner. The MA circuit 128 is further configured to average the products of the voltage and current sample multiplication over time, such as over the course of 6 to 30 AC cycles, in order to generate an estimate of instantaneous energy W. The MA circuit 128 is furthermore configured to accumulate the products of the voltage and current sample multiplication to produce accumulated real energy consumption En. As is known in the art, the resulting sum En represents a measure of real energy consumed by the load, and may be used for billing and the like. However, it will be appreciated that the real energy calculation performed by the MA circuit 128 could be erroneous due to the presence of a relatively strong, extraneous magnetic field in the vicinity of the current sensor 116.

The MA circuit 128 may suitably provide the energy consumption value En to the display 114 and/or communication circuit 112 to allow access to the information by utilities for billing purposes. In addition, the MA circuit 128 in this embodiment provides the average instantaneous energy values W to the leading PF detection circuit 106, as will be discussed further below.

Accordingly, the leading PF detection circuit 106 is a circuit that is configured to detect leading power factors in measurement signals within the meter, and thereby assist in detecting the presence of such an extraneous magnetic field, or more specifically, detect a condition whose cause may by an extraneous magnetic field.

To this end, the leading PF detection circuit 106 is a circuit configured to generate a power factor value PF representative of a phase difference of the current measurement signal with respect to the voltage measurement signal. The leading PF detection circuit 106 is further configured to generate a leading PF detection signal responsive to determining that the power factor value corresponds to a leading power factor that leads unity power factor by more than a predetermined threshold.

The control circuit 108 is a circuit configured to obtain the leading PF detection signal and store information based on, or representative of, the leading PF detection signal in the memory 110. For example, the control circuit 108 may generate a possible magnetic field indication based on the presence of a leading PF for more than a predetermined amount of time, and that indication in the memory 110. The control circuit 108 is further configured to communicate the information representative of or based on the leading PF detection signal to a remote device via the communication circuit 112, and/or display an indication of a possible excess magnetic field based on that information.

With reference to the leading PF detection circuit 106, it has been determined that the presence of an external magnetic field can cause the power factor (which is a measure of phase difference between voltage and current measurement signals) of the measurement signals to be more leading than the actual power factor of the signals provided to the load. The leading PF detection circuit 106 employs this phenomenon to detect and flag potential existence of an excessive magnetic field in the vicinity of the current transformer 116.

More specifically, many residential electricity loads have power factors close to unity or slightly lagging. Power factor, as is known in the art, is a measure of the ratio of real power to apparent power delivered to a load. Power factor may be determined in many ways, including by determining the cosine of the phase difference between voltage and current on an electricity line. If the voltage and current signals to a load are completely in phase, then the load is said to have a unity power factor. Leading loads (where current crosses zero ahead of the voltage zero crossing) and lagging loads (where current crosses zero after the voltage zero crossing) have power factors that differ from unity or 1.

Electric heating loads such as baseboard heating, electric hot water heaters, traditional (non induction) electric ranges, and electric clothes dryers also have power factors near unity. Induction ranges, and induction motors such as for air conditioner compressors or fans have power factors of the order of 0.8 lag. By contrast, leading power factors in residential loads are rare.

As will be discussed below, a causal correlation has been discovered between error induced by strong external magnetic fields and a leading power factor in energy consumption measurements. Specifically, it has been determined that the influence of a strong magnetic field on a meter current transformer ("CT") sensor (e.g. the current transformer 116) can result in a more "leading" power factor in the measurement signals generated by the secondary winding of the CT sensor. Consequently, detection of a leading power factor can be used as an indicator of possible metering inaccuracy.

Figure 3:
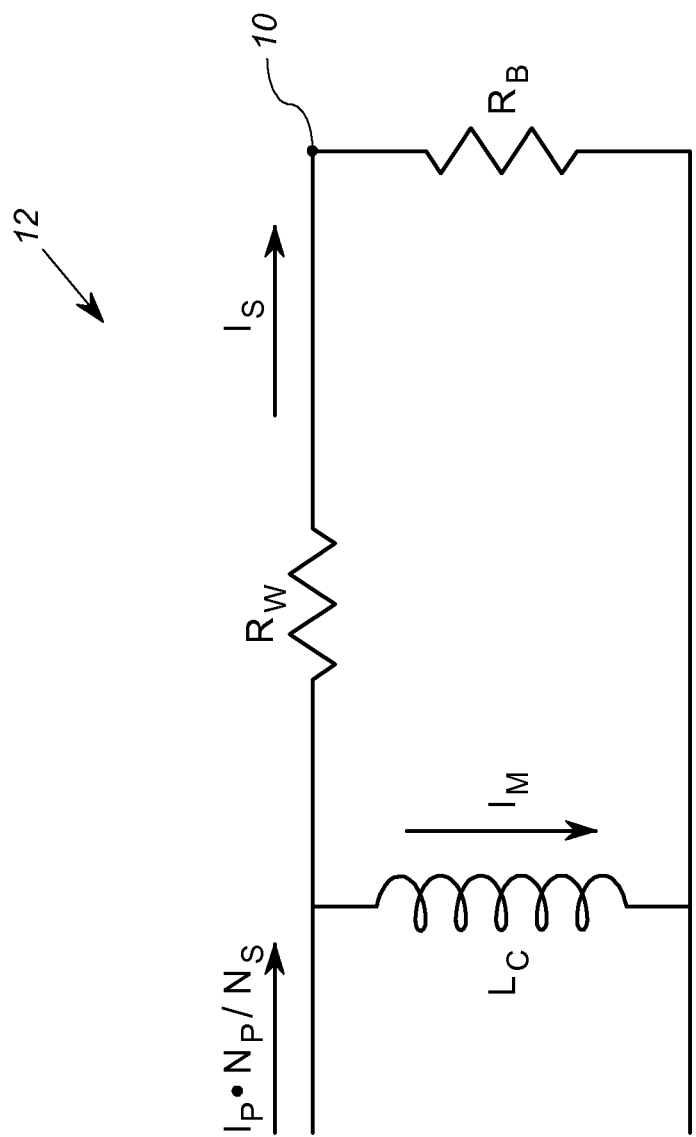
FIG. 3 shows a schematic diagram of an equivalent circuit for a conventional current sensor.

The theory behind the invention associates the influence of a magnetic field with the increase in leading power factor for the measured energy. FIG. 3 is a "typical" simplified equivalent circuit 12 for a prior art current transformer, such as the current transformer 116 of FIG. 1, with an associated burden resistor. In the drawing and discussion of FIG. 3, $I_P$=Primary Current
$I_M$=Magnetizing Current
$N_P$=Primary Turns
$N_S$=Secondary Turns
$L_C$=Transformer Inductance as measured from the secondary
$R_W$=Secondary Winding Resistance $R_B$=Load (Burden) Resistance
ω=Radian Frequency=2π·60 Hz
j=Imaginary operator In an electricity meter, the current measurement is taken from the burden resistor $R_B$, at reference point 10, and is ideally equal to $R_B \cdot I_P \cdot N_P/N_N$. Typically, the current measurement signal from point 10 is sampled, as is the case in the meter arrangement 200. For example, FIG. 1 shows the A/D converter 126 of the measurement circuit 104 coupled to the burden resistor 122. The current measurement sample is then used to calculate watts or energy by multiplying the current measurement samples by sampled voltage measurement signals, as is known in the art and as discussed above in connection with FIG. 1. However, the current measurement signal is affected by non-ideal characteristics of the current transformer (e.g. secondary winding resistance) and externalities, such as an external magnetic field.

Analysis of how non-ideal characteristics can affect the current measurement signal (and create inaccuracies), analysis of the CT equivalent circuit of FIG. 3 is helpful.

Equations 1-3 illustrate application of the node-current circuit analysis to isolate the real and imaginary components of the secondary current $I_S$. The imaginary component relative to the entire value provides an indication of the amount of leading or lagging power factor. In Equation 1, the node at the input of the winding resistor $R_W$ is solved.

In Equation 2, the value $I_S$ is isolated based on Equation 1. Equation 3 solves Equation 2 in a manner that creates separate real and imaginary terms.

$$I_P \cdot \frac{N_P}{N_S} = I_M + I_S = \frac{I_S \cdot (R_W + R_B)}{j\omega L_C} + I_S \quad \text{Equation 1}$$

$$I_S = \frac{I_P \cdot \frac{N_P}{N_S}}{1 + \frac{(R_W + R_B)}{j\omega L_C}} \quad \text{Equation 2}$$

$$I_S = \left[\frac{I_P \frac{N_P}{N_S}}{1 + \left(\frac{R_W + R_B}{\omega L_C}\right)^2}\right]\left(1 + j\frac{R_W + R_B}{\omega L_C}\right) \quad \text{Equation 3}$$

When a permanent magnet is used to saturate the core of a current transformer, the inductance $L_C$ will drop significantly. When this happens, the imaginary portion of the final equation increases in magnitude causing the secondary current $I_S$ to become more leading. As discussed above, the current transformer's secondary current is what is used by the measurement circuitry of the meter to calculate energy consumption. Accordingly, it has been determined that if the meter functionality detects leading power factors beyond a certain threshold, then a leading PF detection flag can be set indicating a potential condition causing metering accuracy.

Referencing Equation 3 above, if a permanent magnet is placed in close proximity to the CT current sensor and the CT core is saturated the inductance "L" will decrease possibly to 0.01 times its original value or less. As a result, the imaginary portion of the equation will increase proportionally compared to the real part of the equation, creating a leading power factor.

In particular, under normal conditions a typical value for $R_W+R_B$ is 100Ω and a typical value for $L_C$ is 50h, the resulting the phase angle of the current $I_S$ is 0.3 degrees. Such normal conditions yield a near-unity power factor of 0.999986. However, if $L_C$ is decreased because of a permanent magnet to 0.01 or 1% of its original value, then the phase angle of the current $I_S$ would become approximately 28 degrees. Such conditions yield a leading power factor of 0.883. As a consequence, detecting such a leading power factor based on its difference from unity power factor can be used to detect such a magnetic field.

It is not always the case that an external magnet would reduce a $L_C$ to 1% of its original value. However, it has been determined that in order to significantly reduce energy registration, or in other words, steal energy, the reduction of $L_C$ due to the external magnetic field must be sufficient. Accordingly, it has been determined that the magnitude of change of $L_C$ that corresponds to relatively significant reduction in measured current and energy can be detected using the detection of leading power factors.

To this end, in another example referencing Equation 3, consider an external magnet that reduces the magnitude of the current $I_S$ by 5%. In such a case, assuming $R_W+R_B$ still have a value of 100Ω, then in order to reduce the magnitude of the current $I_S$ by 5%, a magnetic field must be applied that changes the value of $L_C$ to 1.2h. If $L_C$ is 1.2h, then the phase angle change in the current signal $I_S$ would be 12.5 degrees leading. This change causes a leading power factor of 0.976. Accordingly, any significant reduction in registered current due to the use of a permanent magnet to saturate the core of the CT is also accompanied by a significant change in phase angle and power factor which can be detected and flagged.

Referring again to FIG. 1, the leading PF detection circuit 106 therefore is configured to generate a leading PF detection signal when the power factor of the current measurement signal with respect to the voltage measurement signal leads a unity power factor by more than a predetermined amount. In general, power factor, as is known in the art, is mathematically equivalent to cos(θ) where θ is the angle between voltage and current.

To this end, the leading PF detection circuit 106 in this embodiment determines power factor by calculating a reactive energy ("VAR") using the voltage and current digital measurement signals and dividing the resulting VAR value by an estimate of an instantaneous energy value W. The resulting value is related to power factor. In particular, it is known that:

$$\theta = \text{ArcTan}\left(\frac{VAR}{W}\right)$$

$$PF = \text{Cos}(\theta).$$

Thus, VAR/W provides a measure related to power factor, and a measure of whether the power factor is leading. In particular, if VAR/W is below zero (i.e. a negative number), then power factor (PF) is leading.

Accordingly, to detect a leading PF, the leading PF detection circuit 106 includes a VAR calculator 130, a divider 132, and a comparator 134.

The VAR calculator 130 is a circuit configured to generate reactive energy based on the digital voltage and current measurement signals received from the sensor circuit 102. Multiple methods of performing such calculations are known in the art. Typically, VAR may be calculated in the following manner. Firstly, the VAR calculator 130 multiplies each sample of the current measurement signal by a sample of the digital voltage measurement signal that has been digitally integrated such that it is 90° out of phase from its original power line waveform. Secondly, the VAR calculator 130 sums the products of the multiplication and then takes an average over a predetermined number of AC cycles. Such a VAR calculator, as well as other VAR calculators used in electricity meters, are known in the art.

The divider 132 is an element or circuit configured to divide the instantaneous value of VAR by the power estimate W. To this end, the divider 132 is coupled to receive the value W from the MA circuit 128. The divider 132 is further configured to receive the VAR value from the VAR calculator 132. The divider 132 is operably coupled to provide the value to the comparator 134.

The comparator 134 is configured to compare the ratio of VAR/W to a predetermined threshold TH. The threshold TH is chosen such that it is exceeded (in the absolute value sense) only when the power factor of the current measurement signal (with respect to the voltage measurement signal) leads unity by a predetermined amount, which corresponds to a leading angle of 10° or 15°.

It will be appreciated that a leading power factor will yield a negative value of VAR/W. Thus, in the specific implementation discussed herein, when the power factor leads unity by more than the threshold TH, then VAR/W exceeds TH in a negative sense. In other words, if the value of TH=−0.2, then a value of VAR/W=−0.26, then the comparator would generate a signal indicating a leading power factor that leads by more than the threshold, even though in the absolute number sense VAR/W<TH.

In operation, the sensor circuit 102 generates a voltage measurement signal based on the detected voltage on the current coil 120 and a current measurement signal based on the detected current on the current coil 120. The A/D converter 124 receives the voltage measurement signal and generates a digital voltage measurement signal based thereon, the digital voltage measurement signal in the form of a sampled waveform of the voltage measurement signal. Similarly, the A/D converter 126 generates from the digital current measurement signal a digital current measurement signal in the form of a sampled waveform of the current measurement signal.

The MA circuit 128 receives the digital voltage and current measurement signals and generates energy consumption information therefrom. In particular, the MA circuit 128 multiplies contemporaneous voltage and current samples from the digital voltage and current measurement signals to generate estimates of instantaneous products P. The MA circuit 128 then averages the values of P over several cycles (i.e. for 100 ms to 250 ms) to generate a real power estimate W. The MA circuit 128 also accumulates the resulting values of P in an ongoing manner to produce accumulated real energy consumption En. The MA circuit 128 may suitably provide the energy consumption value En for display via the display 114, or for communication to remote device via the communication circuit 112, for billing purposes and the like.

The MA circuit 128 also provides the power values W to the divider 132 of the leading PF detection circuit 106.

At the same time, the VAR calculator 130 generates the reactive energy value VAR based on the digital voltage and current measurement signals received from the sensor circuit 102. As discussed above, the VAR calculator 130 first multiplies each sample of the current measurement signal by a sample of the voltage measurement signal that has been phase-shifted by 90° of the 60 Hz power line waveform. As above, the phase shift may be carried out by performing digital integration on the sampled voltage waveform. However, it is also possible to simply delay the voltage samples used in the multiplication by a time equivalent to 90° of the AC cycle.

In any event, the VAR calculator 130 then generates an average of such products over a running window extending for a predetermined number of AC cycles. The resulting value is representative of reactive power, or "VAR". The VAR calculator 130 provides the current average VAR value to the divider 132 at about the same time as the MA circuit 128 provides the instantaneous real power W to the divider 132.

The divider 132 divides the instantaneous power estimate W into the contemporaneous value of VAR in an ongoing manner as such values are received by the divider 132. The divider 132 provides the result of the VAR/W calculation to the comparator 134.

The comparator 134 compares the value of VAR/W to a predetermined threshold TH. The comparator 134 generates a leading PF detection signal if VAR/W exceeds TH.

If the leading PF detection signal is generated, then control circuit 108 obtains the leading PF detection signal and stores an indication of a magnetic field event in the memory 110. In some embodiments, the control circuit 108 further determines whether it receives the leading PF detection continuously over a predetermined period of time. For example, the comparator 134 may only generate the leading PF detection signal if VAR/W exceeds TH once or twice, which is not necessarily indicative of a magnetic field event requiring further attention. Thus, the control circuit 108 may only store the magnetic field event indication in the memory 110 if it continually receives a leading PF detection signal for more than one second, five seconds, or several minutes.

The control circuit 108 preferably also communicates the magnetic field event indication to a remote device via the communication circuit 112, and/or displays an indication of possible magnetic field based on the leading PF detection signal on the display 114. In this manner, the utility can be informed of the potential conditions causing ongoing and potentially significant errors in energy consumption metering.

It will be further be appreciated that the proposed leading PF detection method may also be useful for detecting half wave rectified loads which can also lead to significantly under registering of energy. In particular, if the load current has a significant DC current component, such as with a half wave rectified load, the DC component can interact with the magnetic core of the current sensor 116, resulting in a reduction in permeability and a subsequent reduction in inductance. The reduction in inductance creates metering errors, and further results in a leading power factor. Accordingly, the PF detection method described herein may be adapted to detect half-wave rectified loads, which may also require intervention by the utility.

In the above embodiment, it will be appreciated that the meter arrangement 100 may employ one or more programmable processors to carry out the operations of the MA circuit 128, the VAR calculation 130, the divider 132, the comparator 134 and the control circuit 108. As such it will be appreciated that since prior electricity meters typically include programmable processors to carry out the operations of the MA circuit 128, such prior art meters may be modified to incorporate an embodiment of the invention by reprogramming the programmable processors to carry out the additional operations the VAR calculation 130, the divider 132, the comparator 134 and the control circuit 108 as described herein. Moreover, such reprogramming may occur by downloading new software/firmware into the memory 110 via the communication circuit 112, for example, using conventional remote meter communication methods.

Figure 2:
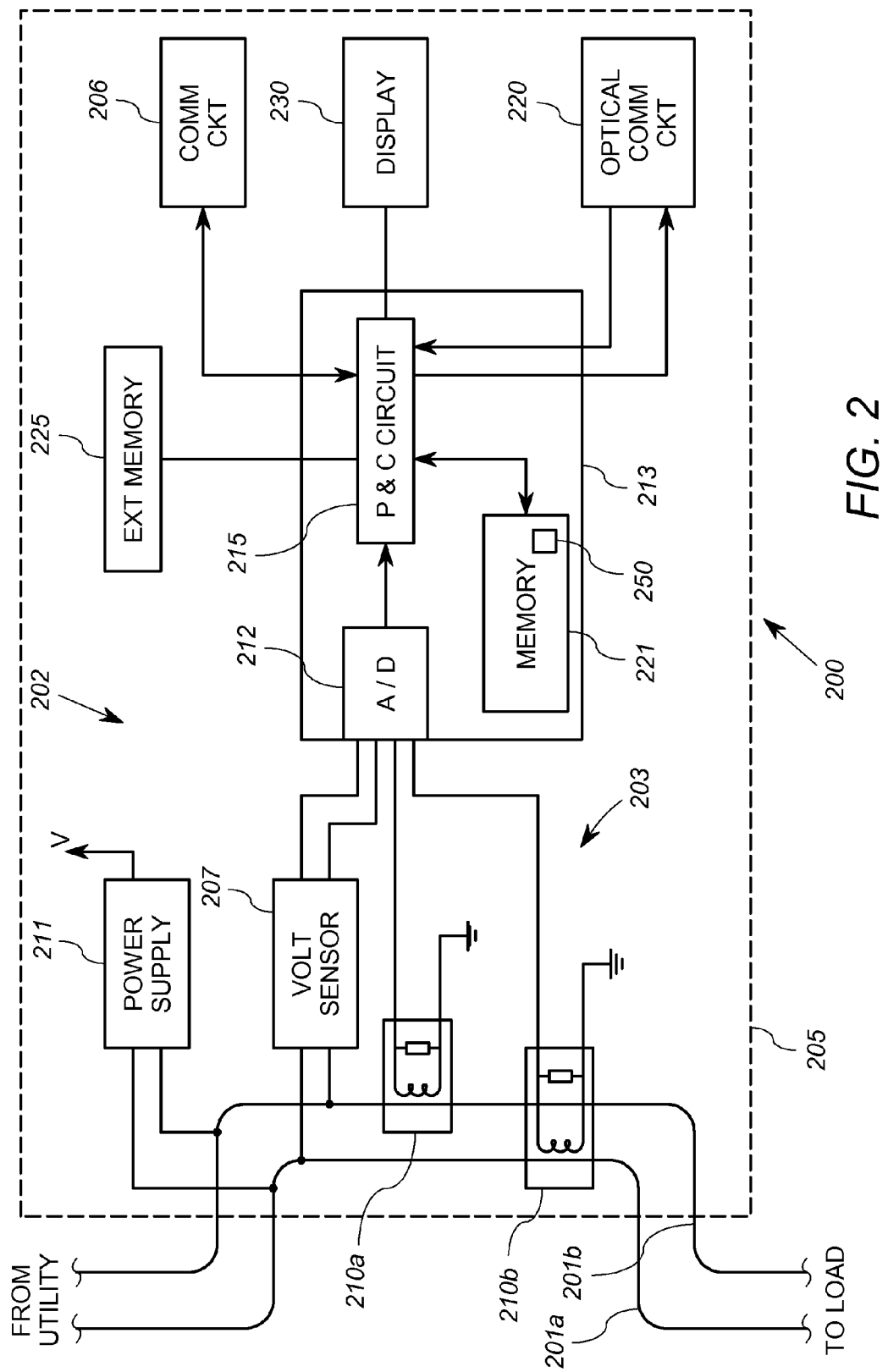
FIG. 2 shows an exemplary processor-based meter having magnetic field detection in accordance with a first embodiment of the invention.

FIG. 2 shows in further detail an exemplary meter 200 that incorporates a magnetic leading PF detection arrangement similar to that of FIG. 1. The meter 200 is configured to, among other things, register energy consumption by a load connected to utility service by two phase (phase A, phase B) power lines 201a, 201b. The meter 200 includes a housing 205 in which are disposed a metrology circuit 202, a remote communication circuit 206, an optical communication circuit 220, data storage 225 and a display 230. The metrology circuit 202 further includes a sensor circuit 203, an A/D conversion unit 212, and at least a portion of a processing and control ("P&C") circuit 215.

It will be appreciated that in the exemplary embodiment, the P&C circuit 215 is disposed within a commercially available chip package 213 that includes the A/D conversion unit 212 and other circuitry normally associated with an electronic meter, such as memory 221, and clock circuitry, not shown. The commercially available chip package 213 may suitably be the Teridian TDK71M6513 measurement chip.

Referring now to the housing 205, the housing 205 may take any suitable form, and is generally configured to withstand a wide range of environmental conditions. The housing 205 also provides at least some protection against environmental conditions to the various elements disposed therein. Suitable housings for utility meters are well-known in the art.

As discussed above, the metrology circuit 202 includes the sensor circuit 203, as well as an A/D conversion unit 212 and the P&C circuit 215. The sensor circuit 203 in this embodiment includes voltage sensors 207 and current sensors 210a, 210b that are operably coupled to detect voltage and current signals representative of voltage and current provided to a load, and to generate measurement signals therefrom. In particular, the measurement signals generated by the voltage sensors 207 are analog signals each having a waveform representative of the voltage provided to the load over power lines 201a, 201b. A suitable example of a voltage sensor 207 includes resistive voltage dividers that are operably coupled to the power lines 201a, 201b. In general, if the voltage on the power lines is represented as the vector quantity $V_{line} = N \cos \theta_v$, then the voltage measurement signal is represented as $\overline{V}_{line} = \mu N \cos \theta_v$, wherein $\mu$ is the voltage division factor.

Similarly, the measurement signals generated by the current sensors 210a, 210b are analog signals each having a waveform representative of the current provided to the load. A suitable example of a current sensor 210a, 210b includes a current transformer that is disposed in a current sensing relationship with the power line signal. These and other voltage and current sensors are known in the art.

A strong magnetic field in the vicinity of at least the current sensors 210a, 210b can cause error in the current measurement signals. In particular, if the current on the power line signal is represented as a vector quantity $I_{line} = M \cos \theta_i$, then a typical measurement signal may be approximated as $I_{meas} = \alpha M \cos(\theta_i + \phi)$, where $\alpha$ is a scalar, fractional, multiple, and $\phi$ is any known phase shift and/or error of the current sensor 210b. A strong magnetic field can add a magnitude error $\beta$ and a phase error $\sigma$. Accordingly, in the presence of a magnetic field, the current measurement signal would be the erroneous value $I_{meas\_err} = \alpha \beta M \cos(\theta_i + \phi + \sigma)$. Such errors can affect the ultimate energy consumption calculations, plus any other calculations made based on current.

Referring again to the meter 200, the A/D conversion unit 212 may be any suitable analog-to-digital converter that is configured to sample the analog measurement signals generated by the sensor circuit 210. The A/D conversion unit 212 is operably coupled to provide the resulting digital voltage and current measurement signals to the P&C circuit 215.

The P&C circuit 215 is a circuit that is configured to receive the digital measurement signals from the A/D conversion unit 212 and generate energy consumption data therefrom. According to an exemplary embodiment, the P&C circuit 215 includes digital processing circuitry that processes the digitized measurement signals to thereby generate the energy consumption data. The A/D conversion unit 212 is configured to generate sampled version of the detected voltage waveforms (as scaled by the voltage sensors 207) and sampled versions of the detected current waveforms (as scaled by the current sensors 210a, 210b).

The P&C circuit 215 is a programmable processing circuit that is configured to operate at least in part based on programming instructions 250 stored in a non-volatile, and externally accessible memory such as the memory 221.

By executing the programming instructions 250, the P&C circuit 215 is configured to generate energy consumption information based on the digital voltage measurement signal and the digital current measurement signal. To this end, the P&C circuit 215 may suitably operate in the manner described above in connection with the MA circuit 128. Further detail regarding such operations is also provided described further below. The programming instructions 250 also cause the P&C circuit 215 to generate a power factor value representative of a phase difference of the current measurement signal with respect to the voltage measurement signal. It will be appreciate that the P&C circuit 215 may determine such a power factor in a plurality of ways, including but not limited to that described above in connection with the leading PF detection circuit 106 of FIG. 1. It will further be appreciated that the P&C circuit 215 may alternatively provide some other measure of how the phase angle of the current measurement signal leads or lags the voltage measurement signal. Such value may also be considered to be a power factor value because it provides substantially identical information, even if it is not strictly in power factor "units".

The programming instructions 250 also cause the P&C circuit 215 to determine whether the power factor value corresponds to a leading power factor that leads unity power factor by more than a predetermined threshold. To this end, the P&C circuit 215 preferably carries out operations such as those described above in connection with the comparator 106 of FIG. 1. In addition, the programming instructions 250 also cause the P&C circuit 215 to store information in the memory 225 indicating a possible excess magnetic field condition (or other condition such as a half-wave rectified load) at least in part responsive to a determination that the power factor value corresponds to the leading power factor that leads unity power factor by more than the predetermined threshold.

In addition, the P&C circuit 215 includes further functionality configured to exercise general supervisory control over data transmission, data display and data storage within the meter 200.

Accordingly, the P&C circuit 215 performs energy data processing, as well as controller operations. In an alternative embodiment, the P&C circuit 215 may be split into two separate devices, such as a digital signal processor ("DSP") and a controller, cooperate to carry out these tasks.

The memory 221 of the chip package 213 includes one or more storage devices of different types. The memory 221 may include volatile or non-volatile RAM, EEPROM, or other readable and writeable memory device, any of which may be incorporated into the integrated circuit package 213. In addition to the programming instructions 250, the memory 221 stores other instructions and/or parameters used by the P&C circuit 215, and may further store energy consumption data. By contrast, the memory 225 is external to the chip package 213, and provides for extended data storage. Such memory 225 would also, however, be located within the housing 205.

The optical communication circuit 220 is operably coupled to the P&C circuit 215. The optical communication circuit 220 in this embodiment includes an optical transceiver, both of which are located at a translucent or transparent optical port, not shown. Similarly, the remote communication circuit 206 is operably coupled to the processing circuit 215. The remote communication circuit 206 may suitably be a power line modem, an RF transceiver, for example, a pager radio, or other wireless device that is capable of transmitting on a WAN, or on another wireless communication network.

The display 230 is operably coupled to the P&C circuit 215 and provides a visual display of information, such as information regarding the operation of the meter 200. For example, the display 230 may provide a visual display of information relating to the power measurement operations or energy consumption data of the meter 200.

The meter 200 also includes a power supply 211 operably connected to receive power from the power lines 201*a*, 201*b*. The power supply 211 is configured to generate bias power for the circuitry of the meter 200 discussed above, including the chip package 213, the display 230, and the communication circuits 206 and 220.

In normal energy delivery operation, the metrology circuit 202 performs operations to detect electrical signals on the power lines 201*a*, 201*b* and generating metering information therefrom. To this end, the voltage sensor 207 detects the voltages on the utility power lines 201*a*, 201*b*, and generates analog voltage measurement signals Va(t) and Vb(t). The analog voltage measurement signals Va(t) and Vb(t) represent scaled versions of the voltage waveforms on, respectively, the power lines 201*a*, 201*b*. Similarly, the current sensors 210*a*, 210*b* generate analog current measurement signals Ia(t) and Ib(t) representative of the detected current waveform on the power lines 201*a*, 201*b*. However, in the presence of a strong magnetic field, the analog current measurement signals Ia(t) and Ib(t) could have an error that causes the phase of current measurement signals Ia(t) and Ib(t) to lead the corresponding phase of the voltage measurement signals Va(t) and Vb(t) more than would be the case with the actual signals on the power lines 201*a*, 201*b*.

In any event, the voltage sensor 207 provides the voltage measurement signals Va(t) and Vb(t) to the A/D converter 212. Similarly, the current sensors 210*a*, 210*b* provide the current measurement signals Ia(t) and Ib(t) to the A/D converter 212. The A/D converter 212 samples the analog measurement signals Va(t), Vb(t), Ia(t) and Ib(t), and thereby generates sampled digital measurement signals Va(n), Vb(n), Ia(n) and Ib(n).

During normal operation, the P&C circuit 215 accumulates one or more energy consumption values based on the digital measurement signals Va(n), Vb(n), Ia(n) and Ib(n), and stores them in the memory 221. The P&C circuit 215 further determines from the digital measurement signals whether current leads or lags voltage in each of phases A and B. The P&C circuit 215 also generates a $VAR_A$ and a $VAR_B$ value, where $VAR_A$ is a reactive energy calculation for phase A (performed in any suitable manner based on Va(n), and Ia(n)), and $VAR_B$ is a reactive energy calculation for phase B (performed in any suitable manner based on Vb(n) and Ib(n)). The following VAR calculations may be employed:

$$VAR_A = \frac{\sum_{n-6k}^{n} Ia(n)*Va(n-k/4)}{6k}$$

$$VAR_B = \frac{\sum_{n-6k}^{n} Ib(n)*Vb(n-k/4)}{6k}$$

wherein n is the current sample, and k is the number of samples in a complete cycle of the 60 Hz waveform. Alternatively, the VAR calculations above may employ a digitally integrated value of Vb(n) instead of (Vb(n−k/4) (i.e. the delayed version of Vb).

The P&C circuit 215 further generates instantaneous power estimates $W_A$, $W_B$ using the following calculations:

$$W_A = \frac{\sum_{n-6k}^{n} Ia(n)*Va(n)}{6k}$$

$$W_B = \frac{\sum_{n-6k}^{n} Ib(n)*Vb(n)}{6k}$$

The resulting values $VAR_A$, $VAR_B$, $W_A$ and $W_B$ are stored in memory 221 and/or local registers for use in further processing. Such further processing includes the leading power factor detection operation and potential magnetic field event detection operation discussed further below and illustrated in FIG. 4. Moreover, one or more of the values $VAR_A$, $VAR_B$, $W_A$ and $W_B$ may be used in other energy consumption data processing.

Figure 4:
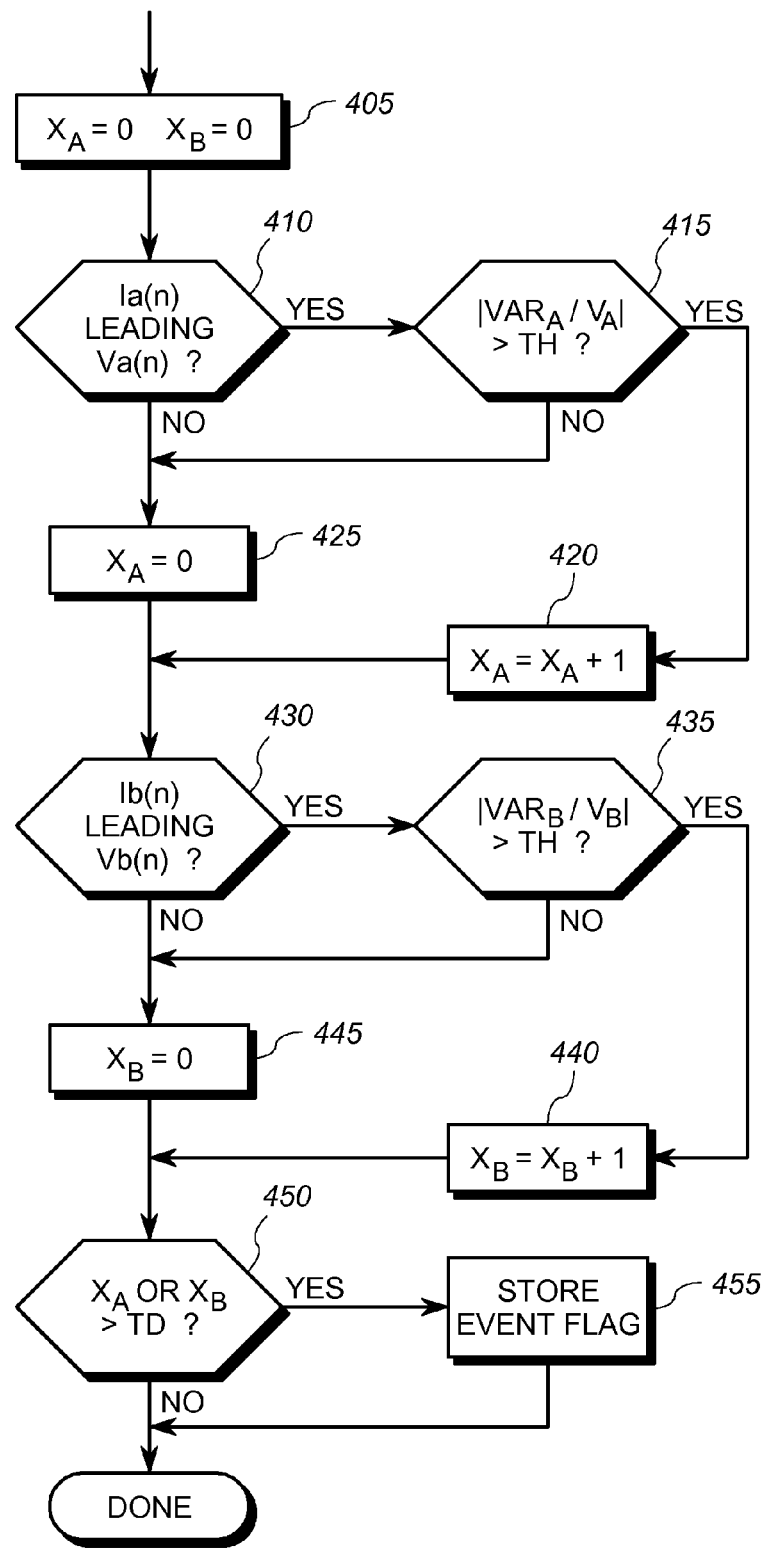
FIG. 4 shows a flow diagram of an exemplary set of operations carried out by a processing circuit of the meter of FIG. 2 to carry out leading power factor detection.

FIG. 4 shows in further details the operation of the P&C circuit 215 in carrying out the above-described operations. The operations of FIG. 4 illustrate the event detection and leading PF detection feature of the meter 200. It will be appreciated that the P&C circuit 215 performs several other operations related to metering that may take several forms, and which are known in the art. Accordingly, the operations of FIG. 4 are carried out by the P&C circuit 215 as part of a set of ongoing running metering operations. In the embodiment described herein, the operations of FIG. 4 are carried out approximately once per second.

Referring now to FIG. 4, in step 405, the P&C circuit 215 first sets counters $X_A=0$ and $X_B=0$. As will become apparent below, the counters $X_A$ and $X_B$ represent a number of consecutive times the P&C circuit 215 determines that the power factor leads unity power factor by more than the predetermined threshold for each corresponding phases A and B.

Thereafter, in step 410, the P&C circuit 215 determines whether the power factor of phase A as measured by the meter 100 is leading. To this end, the P&C circuit 215 determines the sign of $VAR_A/W_A$. If it is negative, then the measured power factor of phase A is leading. Alternatively, the P&C circuit 215 may analyze the zero-crossings of the measurement signals Va(n) and Ia(n). If the current measurement signal Ia(n) has a zero crossing that occurs prior to (and within 90°) of the zero crossing of the voltage measurement signal Va(n), then the current is leading. In any event, if the P&C circuit 215 determines that the power factor of phase A is leading, then the P&C circuit 215 proceeds to step 415. If not, then the P&C circuit 215 proceeds to step 425.

In step 415, the P&C circuit 215 determines whether the absolute value of $VAR_A/W_A > TH$. Step 415 helps ensure differentiate from the presence of small, and therefore relatively insignificant leading power factors, and those that can materially affect energy consumption measurements. The value of TH in this embodiment is chosen such that it is equivalent to a leading power factor that varies from unity by about 0.2. For example, TH=0.2. However, it will be appreciated that other non-zero thresholds may be used. It will further be appreciated that because the absolute value of the $VAR_A/W_A$ is employed, the threshold should be a positive value.

If the P&C circuit 215 determines that the absolute value of $VAR_A/W_A > TH$, then the P&C circuit 215 executes step 420. If not, then the P&C circuit 215 executes step 425. In step 420, the P&C circuit 215 increases the counter $X_A$ by a value of 1. After step 420, the P&C circuit 215 continues to step 430.

In step 425, the P&C circuit 215 resets $X_A$ to 0, as the P&C circuit 215 did not detect a leading power factor greater than the threshold. The P&C circuit 215 thereafter proceeds to step 430.

In step 430, the P&C circuit 215 determines whether the power factor of phase B is leading using any method analogous to those discussed above in connection with step 410. If the P&C circuit 215 determines that the power factor of phase B is leading, then the P&C circuit 215 proceeds to step 435. If not, then the P&C circuit 215 proceeds to step 445.

In step 435, the P&C circuit 215 determines whether the absolute value of $VAR_B/W_B > TH$. If so, then the P&C circuit 215 executes step 440. If not, then the P&C circuit 215 executes step 445. In step 440, the P&C circuit 215 increases the counter $X_B$ by a value of 1. After step 440, the P&C circuit 215 continues to step 450.

In step 445, the P&C circuit 215 resets $X_B$ to 0, as the P&C circuit 215 did not detect a leading power factor greater than the threshold. The P&C circuit 215 thereafter proceeds to step 450.

In step 450, the P&C circuit 215 determines whether either $X_A$ or $X_B$ is greater than a predetermined value TD that corresponds approximately to a predetermined time duration. The predetermined time duration is the minimum duration of time that the P&C circuit 215 detects the leading power factor before registering a potential magnetic field or other inaccurate metering event. Such minimum duration may suitably be selected as discussed further below. Once that minimum duration is known, and if the approximate frequency with which the P&C circuit 215 executes the steps of FIG. 4 is known, then the value TD can be calculated. For example, if the P&C circuit 215 performs the steps of FIG. 4 once every second, and if the minimum duration of a detected leading power factor is sixty seconds, then the value TD should be sixty.

It will be appreciated that the minimum duration (and hence the value of TD) should be chosen to be long enough to avoid temporary or spurious signal conditions, thereby avoiding an excess of "false positives". However, the minimum duration should not be too long either. In particular, in many cases, a residential electrical system can have multiple loads that normally create a lagging power factor. In such cases, the addition of a magnetic field may only result in a "less lagging", as opposed to a leading, power factor. Accordingly, the operations of FIG. 4 may not detect the magnetic field under those conditions. However, during the normal course of operation, there are typically times when the loads creating the lagging power factor are shut down, at least temporarily. During those times, which may be relatively brief, the operations of FIG. 4 will detect the leading power factor. Accordingly, the value TD should not necessarily be chosen to be on the order of days or hours, but rather seconds or minutes.

In any event, in step 450, if the P&C circuit 215 determines that either $X_A$ or $X_B$ exceeds TD, then the P&C circuit 215 proceeds to step 455. If not, then the P&C circuit 215 has completed the operations of FIG. 4. In step 455, the P&C circuit 215 stores in the memory 221 or 225 a flag indicating the possible magnetic field condition, if the flag has not already been set. The P&C circuit 215 may suitably store a date and time stamp with the flag, and any other suitable information. The P&C circuit 215 may also determine from time to time to cause the communication circuit 206 to transmit the information indicating a potential magnetic field near the meter to a remote device, such as to a computer at the utility service provider, not shown. The utility service provider may thereafter send a technician to inspect the meter 200 to determine whether or not the meter 200 is subjected to an external magnetic field that is leading to metering inaccuracy.

The above described embodiment thereby detects when a customer electrical load has a leading power factor that is sustained for at least some significant period of time. It will be appreciated that the P&C circuit 215 may further process the leading power factor information before determining that a potential magnetic field (or half-wave rectified load) has been applied to the meter 200. For example, the P&C circuit 215 may be configured (i.e. programmed) to only communicate a potential magnetic field situation if the leading power factor is detected for the minimum duration (as per step 455) in each of at least three straight days. In another example, the P&C circuit 215 may, after communicating the potential magnetic field indication, send another indication if a leading power factor is not detected for several days, thereby indicating that the magnetic field event may have concluded before inspection is carried out.

It will further be appreciated that P&C circuit 215 may determine power factor in ways other than that described above in connection with FIGS. 1 and 2. For example, the P&C circuit 215 may determine the phase difference between current and voltage measurement signals using only zero-crossing detection. The P&C circuit 215 could determine the power factor based on the phase difference, i.e. the delay in zero-crossings between Va(n) and Ia(n), itself. Other known techniques for determining information representative of power factor within an electricity meter may also be employed As discussed further above, because the energy measurement calculation operations are carried out by programmable processing devices, the above described operations may be used in many meters already deployed in the field with an "over the air" firmware change. In other words, some meters, such as the Focus™ Meter available from Landis+Gyr, Inc., may be programmed remotely. One advantage of the solution described herein is that it may be implemented via firmware and/or software, which facilitates remote implementation of the magnetic field (or half-wave rectifier load) detection arrangement. In the exemplary embodiment of FIG. 2, the operations of FIG. 4 (and any necessary other underlying operations) may be provided in a firmware or software change communicated from a remote location to the meter 200 via the communication circuit 206. Accordingly, another embodiment of the invention is a method of modifying an existing meter to implement the protection against magnetic fields described herein, without having to add physical components.

In will further be appreciated that the operations of steps 410 and 415 may be implemented as a single step, if TH is defined as a negative value with a magnitude corresponding to amount that the power factor of the measurement signals is leading. In such a case, the operations of steps 410 and 415 may simply be combined to a determination as to whether $VAR_A/W_A<TH$. If so, the P&C circuit 215 would proceed to step 420. If not, the P&C circuit 215 would proceed to step 425. Steps 430 and 435 may be implemented as a single step in an analogous manner.

It will be appreciated that the above-described embodiments are merely illustrative, and that those of ordinary skill in the art may readily devise their own implementations and modifications that incorporate the principles of the present invention and fall within the spirit and scope thereof.

I claim:

1. A system for use in an electricity meter, comprising:
   a sensor circuit operably connected to detect voltage and current representative of, respectively, voltage and current provided to a load, the sensor circuit configured to generate a voltage measurement signal based on the detected voltage and a current measurement signal based on the detected current, the sensor circuit including a current sensor susceptible to measurement error due to application of an external magnetic field of sufficient strength thereto;
   a measurement circuit configured to generate energy consumption information based on the voltage measurement signal and the current measurement signal;
   a leading power factor (PF) detection circuit configured to generate a first value representative of a phase difference of the current measurement signal with respect to the voltage measurement signal, the leading PF detection circuit configured to generate a leading PF detection signal responsive to determining that the first value corresponds to a leading power factor that leads unity power factor by more than a predetermined threshold, said predetermined threshold corresponding to an amount of power factor variance caused by presence of measurement error in the current sensor due to application of an external magnetic field; and
   a control circuit configured to obtain the leading PF detection signal and store an event indication in memory responsive at least in part to the leading PF detection signal.

2. The system of claim 1, further comprising a programmable processor configured to carry out the operations of the control circuit, at least some operations of the leading PF detection circuit and at least some operations of the measurement circuit.

3. The system of claim 1, wherein the measurement circuit is further configured to determine a reactive power measurement signal based on the voltage measurement signal and the current measurement signal, and wherein the leading PF detection circuit is further configured to generate the first value based on the energy measurement signal and the reactive power measurement signal.

4. The system of claim 1, wherein the current sensor includes a current transformer.

5. The system of claim 4, wherein the sensor circuit includes a voltage sensor configured to detect the voltage.

6. The system of claim 1, further comprising a communication circuit operably coupled to the processing circuit, and wherein the control circuit is further configured to cause the communication circuit to generate communication signals to a remote device at least in part responsive to receiving at least one leading PF detection signal.

7. The system of claim 2, further comprising:
   a programmable memory configured to store programming instructions for the processing circuit;
   a communication circuit operably coupled to receive a set of programming instructions from a remote device; and
   wherein the processing circuit is configured to execute programming instructions stored in the programmable memory.

8. The system of claim 1, wherein the leading power factor detection circuit is further configured to determine whether the first value corresponds to a leading power factor;
   and responsive to determination that the first value corresponds to a leading factor, determine if the difference between the first value and a value representative of unity power factor exceeds the predetermined threshold.

9. The system of claim 1, wherein the predetermined threshold comprises a value that corresponds to a phase angle of at least 10°.

10. A system for use in an electricity meter, comprising:
    a sensor circuit operably connected to detect voltage and current representative of, respectively, voltage and current provided to a load, the sensor circuit configured to generate a voltage measurement signal based on the detected voltage and a current measurement signal based on the detected current, the sensor circuit including a current sensor susceptible to measurement error due to application of an external magnetic field of sufficient strength thereto;
    an analog-to-digital converter configured to generate a digital voltage measurement signal based on said voltage measurement signal, and further configured to generate a digital current measurement signal based on said current measurement signal;
    at least one memory device;
    a processing circuit, configured to
      generate energy consumption information based on the digital voltage measurement signal and the digital current measurement signal;
      generate a first value representative of a phase difference of the current measurement signal with respect to the voltage measurement signal,
      determine whether the first value corresponds to a leading power factor that leads unity power factor by more than a predetermined threshold, said predetermined threshold corresponding to an amount of power factor variance caused by presence of measurement error in the current sensor due to application of an external magnetic field;
      store information in the at least one memory device indicating a leading PF detection condition at least in part responsive to a determination that the first value corresponds to the leading power factor that leads unity power factor by more than the predetermined threshold.

11. The system of claim 10, wherein the at least one memory includes programming instructions carried out by the processing circuit.

12. The system of claim 10, wherein the processing circuit is further configured to:
- determine a reactive power measurement signal based on the voltage measurement signal and the current measurement signal, and
- generate the first value based on the energy measurement signal and the reactive power measurement signal.

13. The system of claim 10, the current sensor includes a current transformer.

14. The system of claim 13, wherein the sensor circuit includes a voltage sensor configured to detect the voltage.

15. The system of claim 10, further comprising a communication circuit operably coupled the processing circuit, and wherein the processing circuit is further configured to cause the communication circuit to transmit communication signals to a remote device at least in part responsive to the determination that the first value corresponds to the leading power factor that leads unity power factor by more than the predetermined threshold.

16. A system for use in an electricity meter, comprising:
- a sensor circuit operably connected to detect voltage and current representative of, respectively, voltage and current provided to a load, the sensor circuit configured to generate a voltage measurement signal based on the detected voltage and a current measurement signal based on the detected current;
- an analog-to-digital converter configured to generate a digital voltage measurement signal based on said voltage measurement signal, and further configured to generate a digital current measurement signal based on said current measurement signal;
- at least one memory device;
- a processing circuit, configured to
    - generate energy consumption information based on the digital voltage measurement signal and the digital current measurement signal;
    - generate a first value representative of a phase difference of the current measurement signal with respect to the voltage measurement signal,
    - determine whether the first value corresponds to a leading power factor that leads unity power factor by more than a predetermined threshold;
    - store information in the at least one memory device indicating a leading PF detection condition at least in part responsive to a determination that the first value corresponds to the leading power factor that leads unity power factor by more than the predetermined threshold,
- wherein the processing circuit is further configured to
- determine whether the first value corresponds to a leading power factor that leads unity power factor by more than a predetermined threshold repeatedly within a predetermined time period; and
- store information in the at least one memory device indicating a leading PF detection condition at least in part responsive to a determination that the first value corresponds to the leading power factor that leads unity power factor by more than the predetermined threshold repeated within the predetermined time period.

17. The system of claim 16, wherein the processing circuit is further configured to:
- determine a reactive power measurement signal based on the voltage measurement signal and the current measurement signal, and
- generate the first value based on the energy measurement signal and the reactive power measurement signal.

18. The system of claim 16, wherein the sensor circuit includes a current transformer configured to detect the current.

19. The system of claim 18, further comprising a communication circuit operably coupled the processing circuit, and wherein the processing circuit is further configured to cause the communication circuit to transmit communication signals to a remote device at least in part responsive to the determination that the first value corresponds to the leading power factor that leads unity power factor by more than the predetermined threshold within the predetermined time period.

20. The system of claim 16, further comprising a communication circuit operably coupled the processing circuit, and wherein the processing circuit is further configured to cause the communication circuit to transmit communication signals to a remote device at least in part responsive to the determination that the first value corresponds to the leading power factor that leads unity power factor by more than the predetermined threshold within the predetermined time period.

* * * * *